United States Patent [19]
Schumacher et al.

[11] Patent Number: 5,777,528
[45] Date of Patent: Jul. 7, 1998

[54] MODE SUPPRESSING COPLANAR WAVEGUIDE TRANSITION AND METHOD

[75] Inventors: Lawrence James Schumacher, Chandler; Michael L. Fraser, Tempe, both of Ariz.

[73] Assignee: Motorola, Inc., Schaumburg, Ill.

[21] Appl. No.: 452,215

[22] Filed: May 26, 1995

[51] Int. Cl.$^6$ .................................................. H01P 5/08
[52] U.S. Cl. ........................................... 333/33; 333/246
[58] Field of Search ...................................... 333/33, 246

[56] References Cited

U.S. PATENT DOCUMENTS

| | | | |
|---|---|---|---|
| 4,460,880 | 7/1984 | Turner | 333/33 X |
| 4,626,805 | 12/1986 | Jones | 333/246 X |
| 5,270,673 | 12/1993 | Fries et al. | 333/246 |
| 5,399,906 | 3/1995 | Komuro | 333/246 X |

FOREIGN PATENT DOCUMENTS

| | | | |
|---|---|---|---|
| 5102 | 1/1989 | Japan | 333/33 |
| 4117702 | 4/1992 | Japan | 333/33 |

*Primary Examiner*—Benny Lee
*Attorney, Agent, or Firm*—Gregory J. Gorrie

[57] ABSTRACT

A series capacitance is included in both surface ground conductors of coplanar waveguide on an MMIC die. The capacitance compensates for the inductance of bond wires used for transitioning from microstrip line to coplanar waveguide. The capacitance is chosen to resonate with the inductance of the bond wires at the desired frequency. As a result, virtually all microstrip mode ground signal currents are transitioned from the ground plane of the microstrip line to the surface ground conductors of the coplanar waveguide. Microstrip modes affecting the coplanar waveguide are significantly reduced improving isolation between ports of the MMIC die.

13 Claims, 3 Drawing Sheets

MODE SUPPRESSING COPLANAR WAVEGUIDE TRANSITION AND METHOD

FIELD OF THE INVENTION

This invention relates in general to the field of microwave circuitry, in particular to Monolithic Microwave Integrated Circuits (MMICs), and specifically to transitions to coplanar waveguide on MMIC circuits.

BACKGROUND OF THE INVENTION

FIG. 1 is a conceptual diagram of a prior art interface between coplanar waveguide and a microstrip line. Both MMIC die 20 and circuit board 13 are attached to carrier 12. Coplanar waveguide 24 is located on MMIC die 20, and microstrip line 17 is located on circuit board 13. Coplanar waveguide 24 circuitry includes signal ground plane conductors 21 and center conductor 23. Circuit board 13 includes center conductor 17 attached to an insulator 14. Circuit board 13 includes conductive vias 19 which electrically connect bonding regions 18 with carrier 12. Circuit board 13 is coupled to MMIC die 20 by bond wires 7, 8 and 9. Bond wires 7 and 9 couple ground conductors 21 at bonding region 25, with bonding regions 18.

Electromagnetic signals are propagated across MMIC die 20 in a coplanar mode where the signal currents flow on conductor 23 while equal and opposite currents desirably flow on ground plane conductors 21. Ideally, in coplanar waveguide mode, no RF signal current flows in carrier 12. On the other hand, electromagnetic signals are propagated across circuit board 13 in a microstrip mode. RF signals travel along center conductor 17, with carrier 12 acting as the ground plane. Ideally, RF signal current flows on conductor 17 while equal and opposite current flows in carrier 12.

To transition from microstrip mode on circuit board 13 to coplanar waveguide mode in MMIC die 20, all RF ground signal currents associated with microstrip mode in carrier 12 are desirably converted to RF signal currents in ground plane conductors 21 of coplanar waveguide 24. In an ideal transition, no RF signal ground current should remain in carrier 12 after the transition to coplanar waveguide.

For example, current $i_m$ represents the microstrip mode RF ground signal current associated with propagation in circuit board 13. Ideally, ground signal current $i_m$ is converted to current $i_c$ in ground plane conductors 21. No ground signal current should remain in carrier 12 after the transition. However, some current may remain in carrier 12 and is shown as current $i_p$. As an equation, $i_m = i_c + i_p$, where current $i_p$ is desirably zero. The current $i_p$ is caused by, among other things, the non-zero inductance of bond wires 7 and 9, and the finite resistance of vias 19. Those of skill in the art understand these basic principles of microwave circuits.

The existence of signal current $i_p$ under MMIC die 20 results in the occurrence of microstrip modes that exist in the coplanar waveguide. In other words, all of a signal traveling along circuit board 13 is not transitioned to the coplanar waveguide on MMIC 20. As a result, circuit performance is affected. For example, isolation between ports of MMIC die 20 may be reduced, and greater signal losses result.

Thus what is needed is an apparatus that reduces ground current that occurs when transitioning from microstrip to coplanar waveguide. What is also needed is an apparatus that reduces the presence of microstrip modes in coplanar waveguide. What is also needed is an apparatus for transitioning to or from coplanar waveguide. What is also needed is an apparatus for transitioning to or from a coplanar waveguide on an MMIC die. What is also needed is an apparatus that improves isolation between ports of an MMIC die. What is also needed is an apparatus that reduces signal losses in transitioning to and from coplanar waveguide.

SUMMARY OF THE INVENTION

The present invention provides, among other things, an apparatus for reducing microstrip modes when transitioning an RF signal from a microstrip line to a coplanar waveguide. The apparatus provides series capacitance in the ground signal paths of the coplanar waveguide to compensate for bond wire inductance. The coplanar waveguide is defined by a center signal conductor inbetween first and second ground signal conductors disposed on an insulating substrate. The apparatus comprises first and second conductive plates disposed on the insulating substrate and electrically coupled to the respective ground signal conductor. A dielectric layer is disposed over the conductive plates, and first and second conductive regions are disposed at least partially over the dielectric layer. The dielectric layer includes a first portion inbetween the first conductive region and the first conductive plate, and a second portion in-between the second conductive region and the second conductive plate. The first and second dielectric portions define first and second series capacitors. The first and second series capacitors, the first and second conductive regions and the first and second ground signal conductors define respectively the ground signal paths for the coplanar waveguide.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DETAILED DESCRIPTION OF THE INVENTION

The present invention provides, among other things, an apparatus that reduces the amount of microstrip mode ground currents that occur when transitioning from microstrip to coplanar waveguide. The present invention also provides, among other things, an apparatus that reduces the presence of microstrip modes in coplanar waveguide. The present invention also provides, among other things, an apparatus for transitioning to or from coplanar waveguide.

The present invention also provides, among other things, an apparatus for transitioning to or from coplanar waveguide on an MMIC die. The present invention also provides an apparatus that improves isolation between ports of an MMIC die. The present invention also provides an apparatus that reduces signal losses in transitioning to and from coplanar waveguide.

Figure 2:
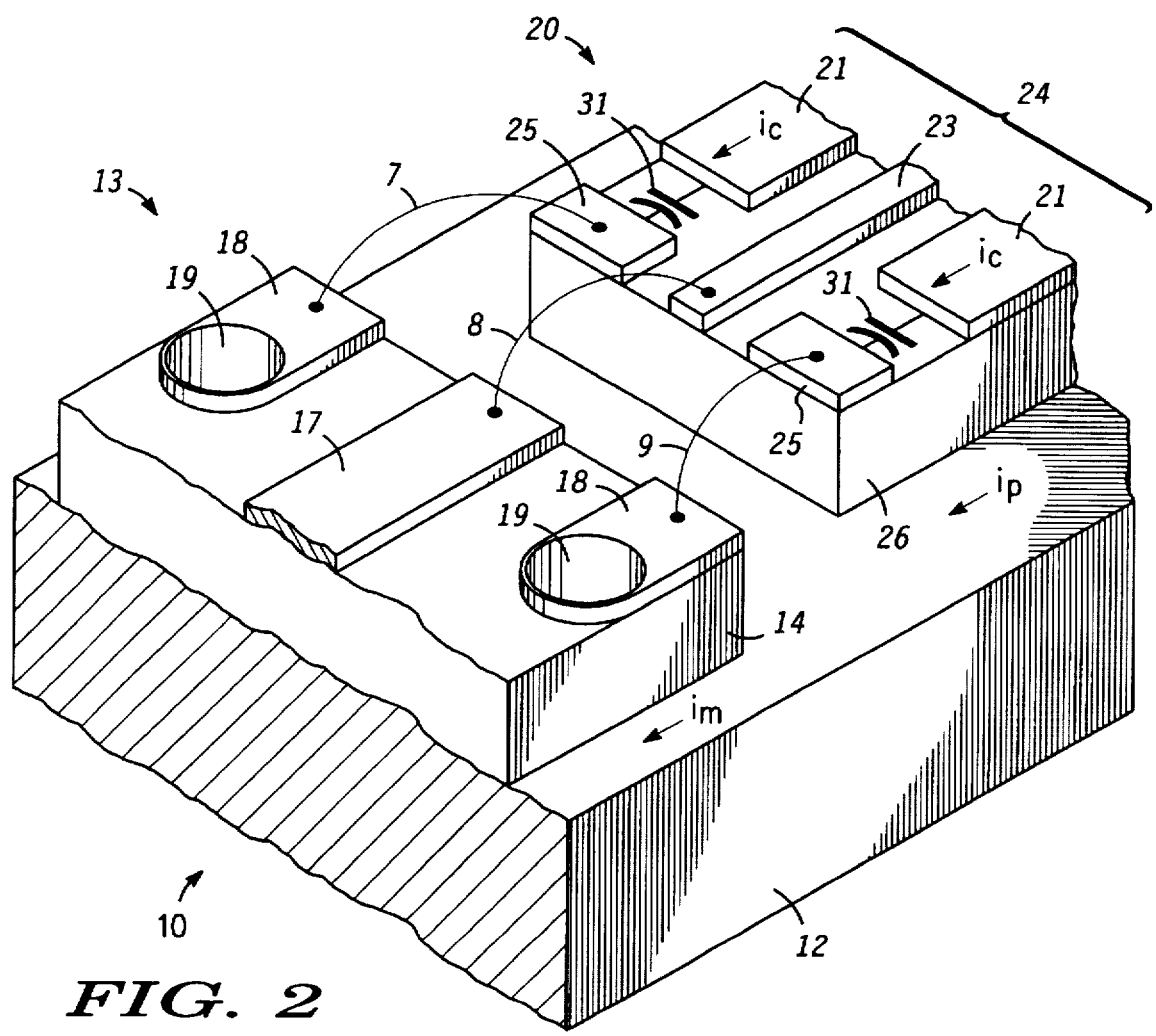
FIG. 2 illustrates a simplified conceptual schematic representation of an interface between coplanar waveguide and microstrip in accordance with the present invention.

FIG. 2 illustrates a simplified conceptual schematic representation of an interface between coplanar waveguide and microstrip in accordance with the present invention. Both MMIC die 20 and circuit board 13 are attached to carrier 12, which is fabricated out of a conductive material, preferably aluminum. MMIC die 20 includes coplanar waveguide circuitry which comprises signal ground plane conductors 21 and center conductor 23. MMIC die 20 is preferably made out of gallium arsenide (GaAs), although Silicon (Si) and other insulator and semiconductor materials are also suitable.

Circuit board 13 includes center conductor 17 attached to an insulator 14. Insulator 14 is preferably made from Duroid, Teflon-fiberglass combinations, or any suitable circuit board material. Circuit board 13 includes conductive vias 19 which electrically connect bonding regions 18 with carrier 12. Bond wires 7 and 9 electrically couple bonding regions 25 of MMIC die 20 with bonding regions 18 of circuit board 13. Bond wire 8 electrically couples center conductor 23 of MMIC die 20 with conductor 17 or circuit board 13.

Figure 1:
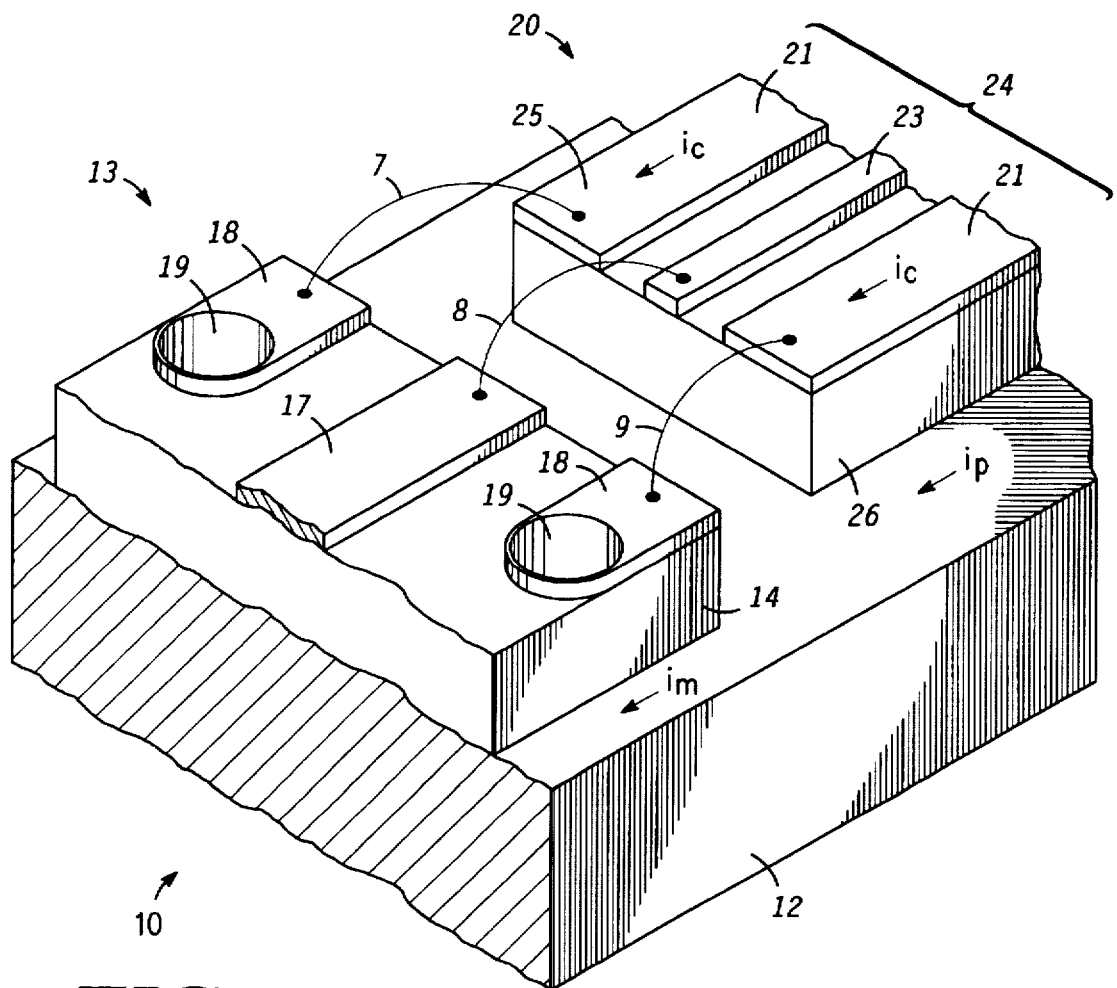
FIG. 1 is a conceptual diagram of a prior art interface between coplanar waveguide and microstrip.

FIG. 2 illustrates a similar situation to that shown in FIG. 1, but shows capacitors 31 in series with each of signal ground plane conductors 21 of coplanar waveguide 24 on MMIC die 20. Capacitors 31 are preferably chosen to resonate with the inductance of bond wires 7 and 9 so that at a desired frequency, an RF short circuit is created between bonding regions 25 and carrier 12. Those of skill in the art understand how to estimate inductance of bond wires and understand how to calculate appropriate values of capacitance.

Preferably, an RF short is created between the ground plane (i.e., carrier 12) of microstrip line 17 and signal ground plane conductors 21 of coplanar waveguide 24. As a result of the RF short, virtually all of the RF microstrip mode ground signal currents in carrier 12 transition to ground plane conductors 21 of coplanar waveguide 24. In other words, all current $i_m$ transitions to currents $i_c$, and current $i_p$ is about zero. Capacitor values may also be chosen to resonate with series inductance of a bond wire and an inductance of a via 19, so that an ideal RF short circuit exists between ground plane (i.e., carrier 12) of microstrip line 17 and signal ground plane conductors 21 of coplanar waveguide 24.

Figure 4:
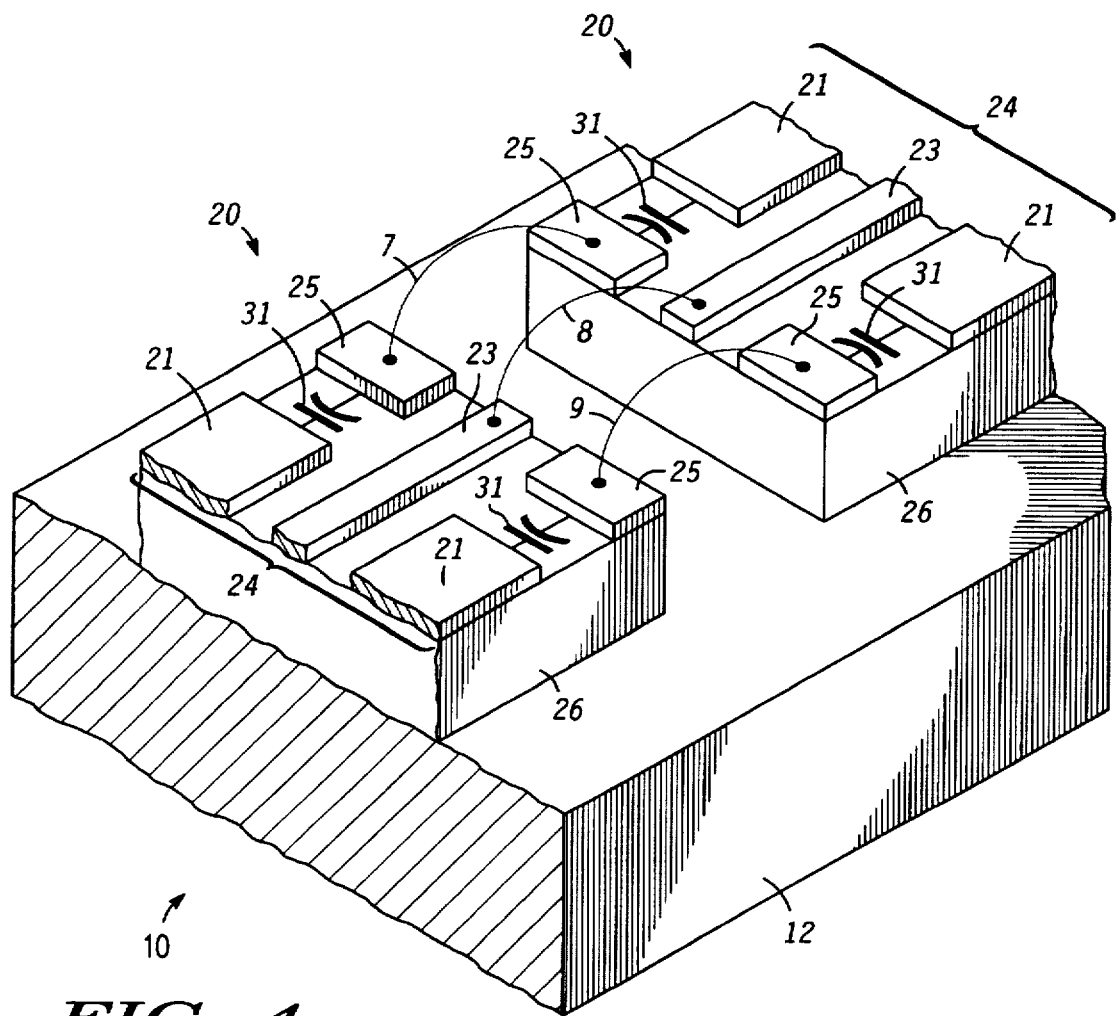
FIG. 4 illustrates a simplified conceptual schematic representation of an interface between two coplanar waveguide in accordance with a preferred embodiment of the present invention.

In another embodiment of the present invention (not shown), capacitors 31 are used for coplanar waveguide to coplanar waveguide transitions. For example, coplanar waveguide 24 may be coupled to another coplanar waveguide 24 on another substrate or circuit board 36. Capacitors 31 may be located on either, or both of the substrates or circuit boards. When capacitors 31 are located on both circuit boards, the capacitance value would be approximately twice that of when they are located on only one substrate or circuit board. This embodiment is shown in FIG 4. The reference labels appearing in FIG. 4 which have the same reference labels as those in previous figures refer to similar items.

In yet another embodiment of the present invention used to transition from coplanar waveguide to microstrip line, capacitors 31 are located on circuit board 13, (e.g., coupled to bonding regions 18) rather than on MMIC die 20.

Figure 3:
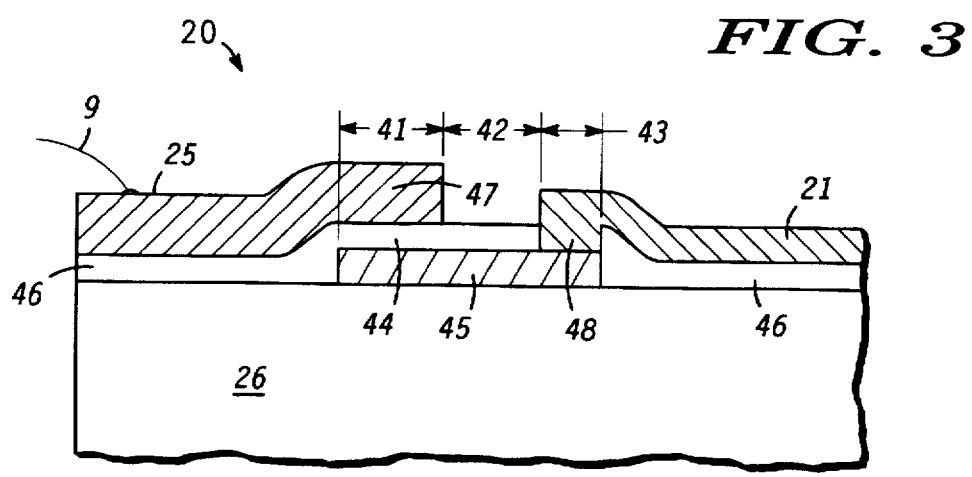
FIG. 3 is a simplified cross sectional view of an MMIC coplanar waveguide interface in accordance with a preferred embodiment of the present invention.

FIG. 3 is a simplified cross sectional view of an MMIC coplanar waveguide interface in accordance with a preferred embodiment of the present invention. The view shown in FIG. 3 is to illustrate structures and is not drawn to scale. MMIC die 20 includes substrate 26 on a carrier 12 (not shown). In the preferred embodiment, die 20 is fabricated from GaAs and the components and dimensions discussed in reference to FIG. 3 are described for this particular embodiment. However, other substrate materials may be used, such as silicon, and the various dimensions would be changed accordingly.

Preferably, MMIC die 20 includes dielectric layer 46 disposed over surface of the GaAs substrate. MMIC die 20 includes signal ground plane conductors 21 of the coplanar waveguide disposed on top of dielectric layer 46. Also shown in FIG. 3 is conductive bonding region 25 disposed over dielectric layer 46. MMIC die 20 also includes conductive plate 45 disposed on GaAs substrate 26 as shown, with a portion 44 of dielectric 46 disposed on top of conductive plate 45. Bonding region 25 includes portion 47 overlapping conductive plate 45.

Capacitor 31 of FIG. 2 is formed by portion 47 of bonding pad 25 and conductive plate 45 separated by a portion 44 of dielectric layer 46. Distance 41 defines an overlap region of portion 47, of dielectric 44 and of plate 45. Those of skill in the art understand that the value of capacitor 31 is determined by, among other things, plate area, which is partially defined by distance 41, and the dielectric constant and the thickness of dielectric layer 46 in region 44.

In the preferred embodiment of the present invention, the thickness of dielectric layer 46 is between 0.2 and 1.0 microns (approximately 0.010 and 0.050 mils). Desirably, the thickness of dielectric 46 is thinner (i.e., slightly less than 0.2 microns or around 0.008 mils) in portion 44 that is disposed over plate 45 in region 41. Suitable dielectrics include silicon nitride (SiN) and polyimide, although those of skill in the art will understand that other dielectrics may be used depending on the substrate material and fabrication process. In the preferred embodiment, overlap distance 41 is on the order of 20 mils, however different distances may be chosen depending on the value of capacitance desired. The thickness of plate 45 is desirably around 0.7 mils, however this is not important for the present invention.

In the preferred embodiment using GaAs, substrate 20 is preferably around 15 mils thick. The conductive material of bonding pad region 25 is preferably around 3.0 microns thick, and is suitable to allow the bonding of bond wires 7 and 9 (FIG. 2). In the preferred embodiment, the thickness of ground plane conductors 21 and center conductor 23 (shown in FIG. 2) is approximately 2.5 microns. Those of skill in the art will understand that the exact thickness of surface conductor is not critical to the present invention. Preferably, surface conductors are made from gold, although other conductive materials may be used.

Also illustrated in FIG. 3 is gap region 42 over dielectric portion 44 between ground plane conductor 21 and region 47 of bonding region 25. This gap isolates ground plane conductors 21 from bonding pad region. In the preferred embodiment, gap region 42 is around 25 mils across, however the exact distance is not critical to the present invention. Those of skill in the art will understand that the RF effects of gap 42 should be considered in design of MMIC die 20. In addition, MMIC die 20 includes an overlap region 43 where ground plane conductor 21 couples with plate 45 at region 48. Desirably, a good RF and DC connection exists between conductor 21 and plate 45 in region 43.

An RF signal traveling from bond wire 9 onto bonding region 25 is coupled across dielectric region 44 onto plate 45, where it is transferred to ground plane conductor 21 of coplanar waveguide 24 (see FIG. 2). The capacitance created by overlap region 41 is chosen to resonate with the inductance of bond wire 9 at the desired RF frequency. In the example where an RF signal transitions from microstrip line to coplanar waveguide 24, almost all of the RF signal is transitioned from microstrip mode to coplanar waveguide mode.

In the preferred embodiment, MMIC die 20 is formed by the following simplified sequence of steps: 1) forming a first conductive layer on substrate 20 for conductive plate 45; 2) forming dielectric layer 46 over both conductive plate 45 and substrate 20; 3) removing some of dielectric layer in region 48; and 4) adding a second conductive layer over dielectric layer 46. The second conductive layer includes conductors 21, 23 and bonding regions 25. The second conductive layer couples with the first conductive layer in region 48. Those of skill in the art will understand that additional steps may be included without affecting the present invention.

In another embodiment of the present invention (not shown) conductive plate 45 is electrically coupled to bonding region 25, while signal ground conductor 21 is separated from conductive plate 45 by dielectric layer 46. In this embodiment, capacitor 31 (FIG. 2) is formed between signal ground conductor 21 and conductive plate 45.

Thus, an apparatus for transitioning to or from coplanar waveguide has been described which overcomes specific problems and accomplishes certain advantages relative to prior art methods and mechanisms. The improvements over known technology are significant. An apparatus has also been described that reduces the amount of microstrip mode ground currents that occur when transitioning from microstrip to coplanar waveguide. An apparatus has also been described that reduces the presence of microstrip modes in coplanar waveguide. An apparatus has also been described for transitioning to or from coplanar waveguide. An apparatus has also been described for transitioning to and from coplanar waveguide on an MMIC die. An apparatus has also been described that improves isolation between RF connections of an MMIC die. An apparatus has also been described that reduces signal losses in transitioning to and from coplanar waveguide.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An apparatus for reducing microstrip modes when transitioning from a microstrip line to a coplanar waveguide, wherein said coplanar waveguide is defined by a center signal conductor inbetween first and second ground signal conductors disposed on an insulating substrate, said center signal conductor being prallel to and planar with said ground signal conductors, and wherein said microstrip line has a signal conductor disposed on a side of a circuit board and a ground plane adjacent to an opposite side of said circuit board, said circuit board having first and second conductive vias respectively electrically coupling said ground plane with first and second bonding pads, said apparatus comprising:

first and second conductive plates disposed on said insulating substrate and electrically coupled to said first and second ground signal conductors, respectively;

a dielectric layer disposed over said first and second conductive plates; and first and second conductive regions disposed at least partially over said dielectric layer, said dielectric layer including a first portion inbetween said first conductive region and said first conductive plate, and a second portion in-between said second conductive region and said second conductive plate, wherein said first and second portions provide first and second series capacitors respectively, said first and second conductive regions for electrically coupling respectively with said first and second bonding pads, and wherein said first and second series capacitors, said first and second conductive regions and said first and second conductive plates provide respectively first and second ground signal paths for said coplanar waveguide.

2. An apparatus as claimed in claim 1 wherein said insulating substrate is comprised of gallium arsenide, wherein said dielectric layer is further disposed inbetween said insulating substrate and said first and second ground signal conductors, and wherein said dielectric layer is further disposed inbetween said insulating substrate said center signal conductor.

3. An apparatus as claimed in claim 2 wherein said microstrip line has a signal conductor disposed on a side of a circuit board and a ground plane adjacent to an opposite side of said circuit board, said circuit board having first and second conductive vias respectively coupling said ground plane with first and second bonding pads, and wherein said first and second conductive regions are electrically coupled respectively by first and second bond wires to said respective first and second bonding pads, and wherein said first and second bond wires each have a respective inductance, and wherein said apparatus operates over a frequency range having a center frequency and wherein said first and second series capacitors have a respective capacitance defined to resonate with said corresponding inductance at or near said center frequency.

4. An apparatus as claimed in claim 3 wherein said first and second conductive vias have a respective via inductance, and wherein said first series capacitor is defined to resonate with said first via and first bond wire inductance at or near said center frequency, and said second series capacitor is defined to resonate with said second via and bond wire inductance at or near said center frequency.

5. An apparatus for transitioning an RF signal to a coplanar waveguide from a microstrip line, said microstrip line has a signal conductor disposed on a side of a circuit board and a ground plane adjacent to an opposite side of said circuit board, said circuit board having first and second conductive vias respectively electrically coupling said ground plane with first and second bonding pads, said apparatus comprising:

an insulating substrate;
first and second ground signal paths; and
a center signal conductor disposed on said insulating substrate said center signal conductor for electrically coupling with said signal conductor of said microstrip line,
wherein said first and second ground signal paths comprise:
first and second respective ground signal conductors disposed on said insulating substrate, said center signal conductor being parallel to and planar with said ground signal conductors, said center signal conductor being inbetween said first and second ground signal conductors.
first and second end conductive regions disposed on said insulating substrate, said first and second end conductive regions for electrically coupling to said first and second bonding pads of said microstrip line; and
first and second capacitive regions respectively coupling said first and second ground signal conductors with said first and second end conductive regions, said first and second capacitive regions defining series capacitance in said respective first and second ground signal paths of said coplanar waveguide.

6. An apparatus as claimed in claim 5 further comprising;
first and second conductive portions electrically coupled to said first and second ground conductors respectively and disposed on said insulating substrate; and
a dielectric layer disposed over said first and second conductive portions,
wherein said first and second end conductive regions are disposed over said dielectric layer, and wherein said respective capacitive regions are defined by said dielectric layer inbetween said respective conductive portions and said respective conductive regions.

7. An apparatus as claimed in claim 6 wherein said circuit board having first and second bonding pads on said first side electrically coupled with said ground plane, wherein said apparatus further comprises:
a first bond wire coupling said first conductive region to said first bonding pad, said first bond wire having a first inductance;
a second bond wire coupling said second conductive region to said second bonding pad, said second bond wire having a second inductance; and
a third bond wire coupling said center signal conductor with said signal conductor of said microstrip line,
wherein said first capacitance region has a first capacitance that is defined to resonate with said first inductance at or near said center frequency, and said second capacitance region has a second capacitance that is defined to resonate with said second inductance at or near said center frequency.

8. An apparatus as claimed in claim 7 wherein said first and second conductive vias have a respective via inductance. and wherein said first and second capacitance is further defined to resonate with said corresponding via inductance and said respective bond wire inductance at or near said center frequency.

9. A coplanar waveguide comprising:
an insulating substrate;
first and second ground signal paths; and
a center signal conductor disposed on said insulating substrate.

wherein said first and second ground signal paths comprise:
first and second respective ground signal conductors disposed in parallel on said insulating substrate. wherein said center signal conductor is disposed inbetween said ground signal conductors, and wherein said center signal conductor is parallel to and planar with said first and second ground signal conductors;
first and second respective end conductive regions; and
first and second series capacitors coupling respectively, said first and second ground signal conductors with said first and second respective end conductive regions, said first and second series capacitors being electrically coupled in series with said respective first and second ground signal conductors and said corresponding first and second end conductive regions.

10. A coplanar waveguide comprising;
a first portion; and a second portion electrically coupled to said first portion by bond wires, wherein said first portion comprises:
a first insulating substrate;
first and second ground signal paths; and
a first center signal conductor disposed on said first insulating substrate, wherein said first and second ground signal paths comprise;
first and second respective ground signal conductors disposed in parallel on said first insulating substrate, said center signal conductor being inbetween and planar with said first and second ground signal conductors;
first and second respective end conductive regions; and
first and second series capacitors coupling respectively, said first and second ground signal conductors with said corresponding first and second end conductive regions,
wherein said second portion comprises:
a second insulating substrate;
third and fourth ground signal paths; and
a second center signal conductor disposed on said second insulating substrate,
wherein said third and fourth ground signal paths comprise:
third and fourth respective ground signal conductors disposed in parallel on said second insulating substrate, said second center signal conductor being inbetween and planar with said third and fourth ground signal conductors;
third and fourth respective end conductive regions; and
third and fourth series capacitors coupling respectively, said third and fourth ground signal conductors with said corresponding third and fourth end conductive regions, and
wherein said first and second ground signal conductors are electrically coupled with said third and fourth ground signal conductors respectively, by corresponding first and second ones of said bond wires, and wherein said first and second center signal conductors are electrically coupled by a third one of said bond wires.

11. A device as claimed in claim 10 wherein said first and second insulating substrates are each comprised of Gallium Arsenide.

12. A method for reducing microstrip modes when transitioning an RF signal from a microstrip line to a coplanar waveguide, said RF signal being in a coplanar waveguide mode when in said coplanar waveguide and said RF signal being in a microstrip mode when in said microstrip line, wherein said coplanar waveguide is defined by first and second ground paths and a center conductor disposed on an insulating substrate, said first and second ground paths respectively comprising first and second ground signal conductors and corresponding first and second series capacitors, said center conductor being in parallel to and planar with said first and second ground conductors, and wherein said microstrip line has a signal conductor disposed on a side of a circuit board and a ground plane adjacent to an opposite side of said circuit board, said circuit board having first and second conductive vias respectively coupling said ground plane with first and second bonding pads, said method comprising the steps of:

provifding first and second conductive plates disposed on said insulating substrate and electrically coupled to said first and second ground conductors, respectively;

providing a dielectric layer disposed over said first and second conductive plates; and providing first and second conductive regions disposed at least partially over said dielectric layer, said dielectric layer including a first portion in-between said first conductive region and said first conductive plate, and a second portion in-between said second conductive region and said second conductive plate, said first and second portions respectively providing said first and second series capacitors in series with said respective ground conductors, wherein said first and second conductive regions are electrically coupled respectively by first and second bond wires to said first and second bonding pads, said first and second bond wires each having a respective inductance, and wherein said signal conductor is electrically coupled to said center conductor by a third bond wire; and converting said RF signal from said microstrip mode in said microstrip line to said coplanar waveguide mode in said coplanar waveguide, wherein said respective series capacitor resonates with said respective inductance at or near a center frequency of said RF signal.

13. A method as claimed in claim 12 where the transition step includes, said first and second conductive vias having a respective via inductance, and wherein said first series capacitor is defined to resonate with said first via and first bond wire inductance, and said second series capacitor is defined to resonate with said second via and bond wire inductance.

* * * * *

UNITED STATES PATENT AND TRADEMARK OFFICE
CERTIFICATE OF CORRECTION

PATENT NO.  : 5,777,528
DATED       : July 7, 1998
INVENTOR(S) : Lawrence James Schumacher and Michael L. Fraser It is certified that error appears in the above-identified patent and that said Letters Patent is hereby corrected as shown below:

Claim 1, column 6, line 2: word "prallel" should be "parallel".

Signed and Sealed this

Eighth Day of September, 1998

Attest:

BRUCE LEHMAN

*Attesting Officer*                *Commissioner of Patents and Trademarks*